(12) United States Patent
Baker et al.

(10) Patent No.: US 8,712,066 B1
(45) Date of Patent: Apr. 29, 2014

(54) AUDIO SIGNAL CLIP DETECTION

(71) Applicants: David D. Baker, Gilbert, AZ (US); James C. Strickland, Mesa, AZ (US)

(72) Inventors: David D. Baker, Gilbert, AZ (US); James C. Strickland, Mesa, AZ (US)

(73) Assignee: Rockford Corporation, Tempe, AZ (US)

(*) Notice: Subject to any disclaimer, the term of this patent is extended or adjusted under 35 U.S.C. 154(b) by 0 days.

(21) Appl. No.: 13/829,983

(22) Filed: Mar. 14, 2013

(51) Int. Cl.
*H04R 29/00* (2006.01)

(52) U.S. Cl.
USPC ............................................. 381/56; 381/120

(58) Field of Classification Search
USPC ....................................................... 381/120
See application file for complete search history.

(56) References Cited

U.S. PATENT DOCUMENTS

| | | | |
|---|---|---|---|
| 2,782,366 A | 2/1957 | Wall | 324/623 |
| 3,255,407 A | 6/1966 | Straszewicz | 324/623 |
| 3,890,570 A | 6/1975 | Kristensen et al. | 324/76.17 |
| 3,991,370 A | 11/1976 | Pate | 455/108 |
| 4,048,573 A | 9/1977 | Evans et al. | 330/2 |
| 4,071,781 A | 1/1978 | Kayalioglu | 327/165 |
| 4,175,256 A | 11/1979 | Dolikian | 327/61 |
| 4,208,548 A | 6/1980 | Orban | 381/94.8 |
| 4,233,566 A | 11/1980 | Nestorovic | 330/59 |
| 4,267,515 A | 5/1981 | Terui et al. | 327/17 |
| 4,344,028 A | 8/1982 | Bank et al. | 324/620 |
| 4,706,290 A | 11/1987 | Lin | 381/58 |
| 4,818,947 A | 4/1989 | Zucker et al. | 324/623 |
| 5,068,620 A | 11/1991 | Botti et al. | 330/2 |
| 5,239,693 A | 8/1993 | Gailus et al. | 455/115.2 |
| 5,430,409 A | 7/1995 | Buck et al. | 330/2 |
| 5,453,716 A | 9/1995 | Person et al. | 330/2 |
| 5,487,016 A | 1/1996 | Elms | 702/71 |
| 6,012,639 A * | 1/2000 | Colley et al. | 235/462.16 |
| 6,061,455 A | 5/2000 | Hadley et al. | 381/57 |
| 6,956,430 B2 | 10/2005 | De Poortere | 330/2 |
| 7,202,731 B2 | 4/2007 | Krochmal et al. | 330/2 |
| 7,783,062 B2 | 8/2010 | Xiao | 381/94.1 |
| 8,036,402 B2 | 10/2011 | Furge | 381/120 |
| 2009/0261899 A1 | 10/2009 | Gomez et al. | 330/2 |
| 2010/0026385 A1 | 2/2010 | Wen et al. | 330/2 |
| 2013/0044886 A1 | 2/2013 | D'Amore et al. | 381/56 |

OTHER PUBLICATIONS

Hewlett Packard—Harmonic Wave Analyzer 300A, 1941—one page from http://www.hp.com/hpinfo/abouthp/histnfacts/museum/earlyinstruments/0009/index.html, unknown author(s), admitted prior art.
SMD—Distortion_Detector_DD-1_Owner's Manuel_Ver._1, 18 pages, unknown author(s), 2011.
http://www.cordellaudio.com/papers/thd_analyzer.pdf, Build a High Performance THD Analyzer, pp. 34-61, Robert R. Cordell, Sep. 1981.

(Continued)

*Primary Examiner* — Joseph Saunders, Jr.
(74) *Attorney, Agent, or Firm* — The Patent Source

(57) ABSTRACT

Methods and apparatus for audio signal clip detection are disclosed. The clip detectors may receive audio signals, from which peak reference signals, indicative of the highest voltage of the received audio signals, may be derived. The received audio signals may also be differentiated and phase-lagged to produce differentiated audio signals which may, in turn, be rectified to produce rectified differentiator signals. The rectified differentiator signals and the peak reference signals may be compared to thereby produce clip detect signals indicative of whether the received audio signals are clipped. The clip detect signals may then be used to indicate whether the received audio signal are clipped.

18 Claims, 12 Drawing Sheets

(56) References Cited

OTHER PUBLICATIONS

1948 Hewlett-Packard Laboratory Instruments Catalog 19-A, preserved and distributed by www.hparchive.com, 9 pages including pp. 20-25.

NTI—*Minilyzer ML1*—Audio Analyzer, three pages, date unknown, author unknown, from http://www.nti-audio.com/en/products/minilyzer-ml1.aspx.

Six pages from http://www.talkaudio.co.uk/ipb/index.php/topic/295638-market-research-would-you-like-a-cheap-portable-clipping-detector/page_p__3498109#entry3498109, Market research: Would you like a cheap portable clipping detector?, dated Jul. 9, 2009-Dec. 19, 2009, multiple unknown authors, admitted prior art.

Five pages from http://forum.allaboutcircuits.com/showthread.php?t=37716, Thd measurement. dated Apr. 28, 2010-May 16, 2010, multiple unknown authors, admitted prior art.

Three pages from http://www.circuitsgallery.com/2012/12/low-pass-filterintegrator-circuit-using.html, Low Pass Filter/Integrator Circuit Using Op amp 741, Dec. 23, 2012, unknown author.

Two pages from Marconi Instruments Limited—TF2330 Wave Analyser—https://sites.google.com/site/marconiinstrumentslimited/tf2330-wave-analyser, date(s) unknown, unknown author(s), admitted prior art.

Twelve pages from http://rane.com/note145.html—Audio Specifications—Dennis Bohn, 2000-2003.

\* cited by examiner

AUDIO SIGNAL CLIP DETECTION

BACKGROUND OF THE INVENTION

1. Field of the Invention

The present invention is directed to systems, software, processes, and/or apparatus for detecting audio signal clipping. Accordingly, the general objects of the invention are to provide novel systems, software, methods, and/or apparatus such character.

2. Description of the Related Art

It is well known that audio signal sources have a finite output voltage level capability. Maximum output capability is typically determined by the supply voltage available to the audio components in the signal path. Audio signal clipping results when the output signal level exceeds the available supply voltage. Audio signal clipping is generally not desired because, when clipping occurs, the audio signal is no longer a linear representation of the original unclipped signal; this increases total harmonic distortion and reduces the quality of the audio signal. It is, therefore, generally preferred that the audio signals remain unclipped through the entire signal path to a listening device.

Such considerations are particularly important in automotive audio systems where a typical signal path may include one or more signal sources, preamplifiers, and power amplifiers that are separated from one another. If any one or more of the signal sources, preamplifiers, and power amplifiers exceed their capability, a clipped signal will result. Thus, various level-setting methods and apparatus have been employed to achieve maximum capability at each stage of the signal path and to minimize or eliminate clipping of the system as a whole.

If the maximum unclipped output voltage of an audio source is known, creating a fixed reference voltage for comparison to the known maximum output level would be a suitable method for clip detection and/or prevention. Current solutions of this nature involve monitoring the output of the amplifier to determine if a clipped signal is generated. Once a clipped signal is detected, the preamplified signal is adjusted to limit the amount of clipping. In, Botti et al. U.S. Pat. No. 5,068,620, the amplifier input voltage acts as a reference and is compared to the amplifier output. When the input voltage increases above the output voltage a detect signal is activated. In Buck et al. U.S. Pat. No. 5,430,409, the amplifier output voltage, minus fixed gain, is compared to the amplifier input voltage. A detect signal is activated when the input voltage exceeds the reference voltage. This method also incorporates an adjustable dc offset plus reference voltage which programs the total clipping distortion permitted before the detect signal is activated.

However, in many instances, the maximum unclipped output signal level from an audio source is unknown. In such instances, audio component input clip detection is desired.

SUMMARY OF THE INVENTION

The present invention satisfies the above-stated needs and overcomes the above-stated and other deficiencies of the related art by providing methods, software, systems and apparatus for audio signal clip detection.

One aspect of the present invention is directed to an audio signal clip detector with an audio input for receiving the audio signal. The clip detector may have a peak hold, electrically associated with the audio input, for generating a peak reference signal indicative of the highest voltage of the audio signal received by the audio input. The clip detector may also have a differentiator, electrically associated with the audio input, for differentiating and phase-lagging the audio signal received by the audio input to thereby produce a differentiated audio signal. The differentiator may also have a rectifier for rectifying the differentiated audio signal to thereby produce a rectified differentiator signal. A comparator may be electrically associated with the peak hold and the differentiator, and may compare the rectified differentiator signal and the peak reference signal to thereby produce a clip detect signal indicative of whether the audio signal received by the audio input is clipped. The clip detector may also have an indicator, responsive to the clip detect signal, for indicating whether the audio signal received at the audio input is clipped.

Some of the preferred embodiments of the invention may implement the peak hold, differentiator and comparator as analog circuitry. While some apparatus embodiments of the invention may generate positive rectified signals in the peak hold and in the differentiator, other embodiments may generate negative rectified signals in the peak hold and in the differentiator.

Some analog circuitry embodiments of the invention may employ a diode within the peak hold circuit and four diodes in the differentiator circuit. Other embodiments of the invention may employ at least one buffer between the input and the peak hold circuit, the buffer having a feedback loop with a diode; these embodiments may employ as few as two diodes in the differentiator circuit.

Those of ordinary skill will readily appreciate that the inventive input clip detectors disclosed herein may reside within an audio component that serves another function (such as a receiver, CD player, equalizer, preamplifier, amplifier, etc.) Alternatively, inventive detectors may be in the form of a stand-alone device including, but not limited to, devices with a handheld form-factor. Such devices may include a housing that encloses the audio input, the peak hold, the differentiator, the comparator, and the indicator such that the audio input and the indicator are user-accessible. Providing electrical power by any known means (batteries, a remote power supply, with solar capabilities, etc) to any of the disclosed detectors is within the skill of an ordinary artisan.

The invention can also take the form of a method of detecting audio signal clipping in which a received audio signal may be used to generate a peak reference signal indicative of the highest voltage of the received audio signal. The received audio signal may also be differentiated and phase-lagged to thereby produce a differentiated audio signal and the differentiated audio signal may be rectified to produce a rectified differentiator signal. The peak reference signal may be compared with the rectified differentiator signal to thereby produce a clip detect signal indicative of whether the received audio signal is clipped. Finally, the method may include the step of indicating, responsive to the clip detect signal, whether the received audio signal is clipped.

Naturally, the above-described methods of the invention are particularly well adapted for use with the above-described apparatus of the invention. Similarly, the apparatus of the invention are well suited to perform the inventive methods described above.

Numerous other advantages and features of the present invention will become apparent to those of ordinary skill in the art from the following detailed description of the preferred embodiments, from the claims and from the accompanying drawings.

BRIEF DESCRIPTION OF THE DRAWINGS

The preferred embodiments of the present invention will be described below with reference to the accompanying drawings where like numerals represent like steps and/or structures and wherein.

DETAILED DESCRIPTION OF THE PREFERRED EMBODIMENTS

Figure 1:
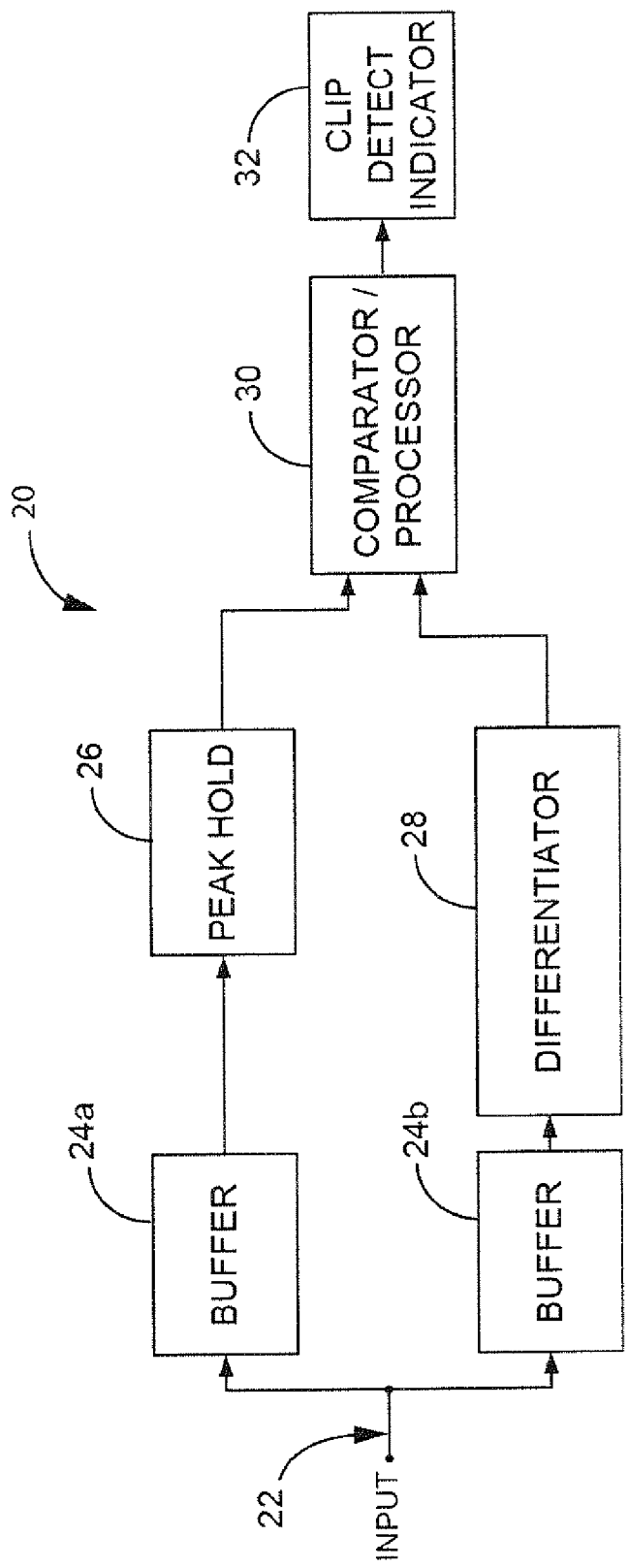
FIG. 1 is a functional block diagram of an audio signal clip detector in accordance with one preferred embodiment of the present invention.

FIG. 1 is a functional block diagram of an audio signal clip detector 20 illustrating one possible preferred embodiment of the invention. As shown, detector 20 may include an input 22 electrically associated with a peak hold 26 and a differentiator 28 and with optional buffers 24a and 24b. Also as shown, detector 20 may also include a comparator/processor 30 electrically associated with peak hold 26, differentiator 28 and a clip detect indicator 32.

An audio signal may be received by audio input 22 and may be generated from an external source/component such as a radio, a CD player, an MP3 player, an equalizer, a preamplifier, a power amplifier, a signal generator, or other audio source known in the art (not shown). The input signal may be either balanced or unbalanced and may be applied to peak hold 26, either directly or through optional buffer 24a. The input signal is also applied to differentiator 28, either directly or through optional buffer 24b. The output of peak hold 26 may be applied to one input of comparator 30 and the output of differentiator 28 may be applied to the opposite input of comparator 30. A clip detect signal output from comparator 30 may be set at voltage high or voltage low, depending on the polarity configuration of the clip detect indicator 32 and on whether the audio input signal is clipped or non-clipped.

Figure 2:
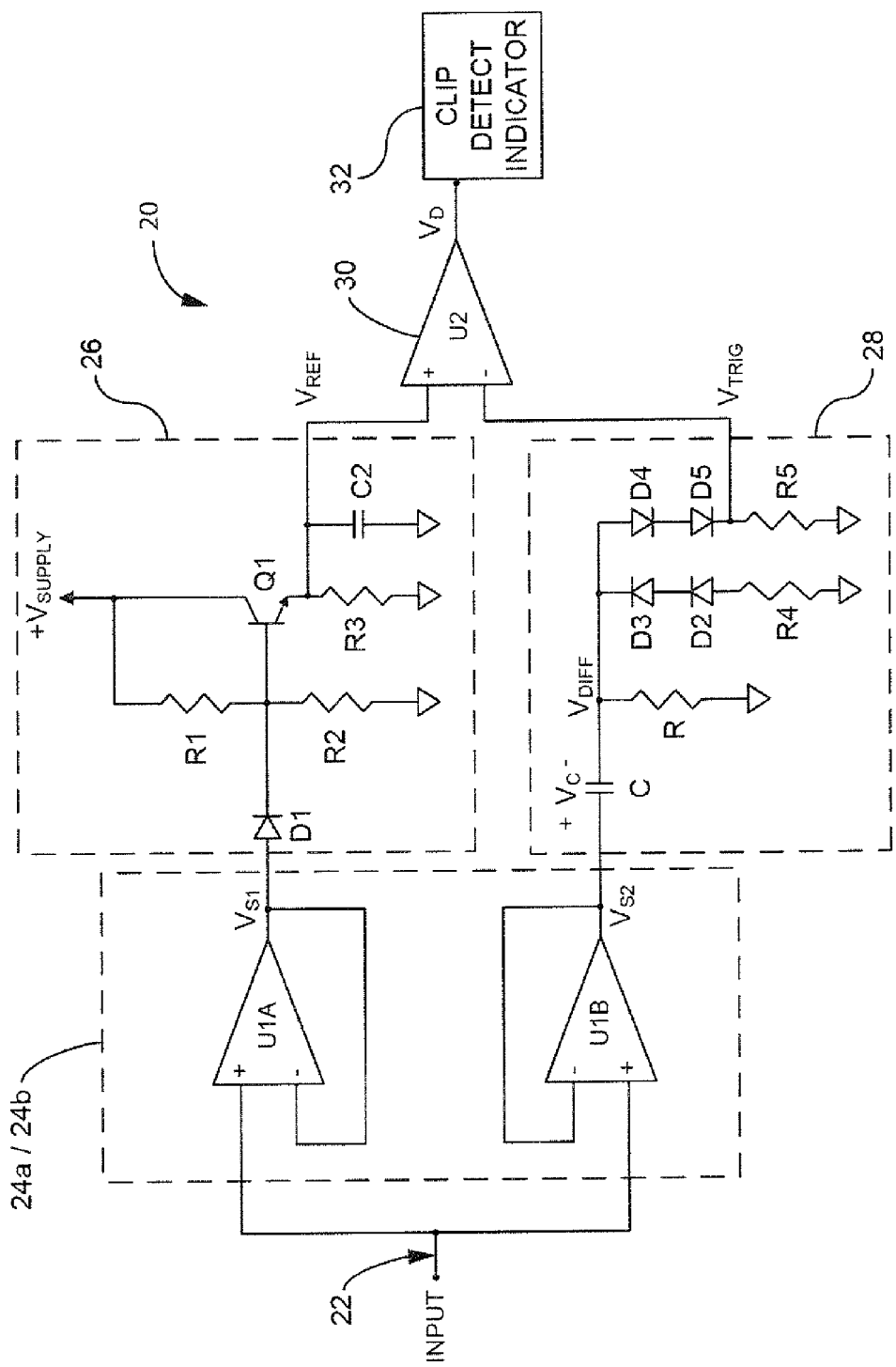
FIG. 2 is a schematic diagram of the audio signal clip detector in accordance with a first preferred analog circuitry embodiment of the present invention.

FIG. 2 is a schematic diagram of an analog circuitry implementation of the audio signal clip detector 20 of FIG. 1. As shown, an audio input signal may be applied to the non-inverting inputs of the analog operational amplifiers U1A and U1B preferably configured as unity gain buffers. Buffers U1A and U1B act as high impedance buffers to prevent loading effects from upstream circuit stages. Buffers U1A and U1B also electrically isolate peak hold circuitry 26 from differentiator circuitry 28; as such, almost any conventional buffer having a high impedance input and a low impedance output may be used.

The acceptable audio input signal voltage levels can be specified at any value as long as the resulting voltages do not exceed the rated operating voltages of the various components in the circuit as shown. Audio input signals also should not exceed the supply voltages of the operational amplifiers and comparator shown. However, those of ordinary skill will recognize that exceeding the supply voltages of the operational amplifiers and comparator can be prevented by dividing down the input signal voltage (with conventional circuits and/or methods) prior to the inputs of buffers U1A and U1B to a value that is within acceptable voltage levels.

In the circuit shown in FIG. 2, the buffered audio signal at the output of U1A may be applied to analog peak hold circuit 26 where it is preferably positively rectified by diode D1. Resistors R1 and R2 form a voltage divider that, in conjunction with transistor Q1, pre-charges capacitor C2 with no signal present. The pre-charge voltage value at capacitor C2 is determined by supply voltage+Vsupply, and resistors R1 and R2. The pre-charge of capacitor C2 helps prevents false clip detect at the initial signal transition when time t=0, where t=0 is defined as the moment before the initial transition of the audio input signal.

In an alternative embodiment, op amps U1A and U1B may be configured to apply gain to the input signal being detected so that any minimum audio input signal can be clip detected. The gain ratios of U1A and U1B should be at least substantially equal and the resulting amplitude of the audio signal at VS1 must be large enough to compensate for the forward-bias-diode voltage drops of diode D1 and transistor Q1 to maintain ability to charge capacitor C2.

In the preferred analog peak hold circuit 26, transistor Q1, configured as an emitter follower, provides practical current drive capability to charge capacitor C2. The charging current for capacitor C2 is preferably reasonably unimpeded because charge current limiting at the initial charge of capacitor C2 could place the peak hold reference signal Vref at an incorrect low value and this condition could cause the clip detect to falsely trigger. This is especially true at system start up, when capacitor C2 is initially charged at the first transition of the audio input signal. Transistor Q1 also serves as a high impendence buffer, preventing discharge of capacitor C2 through resistor R2.

Figure 3:
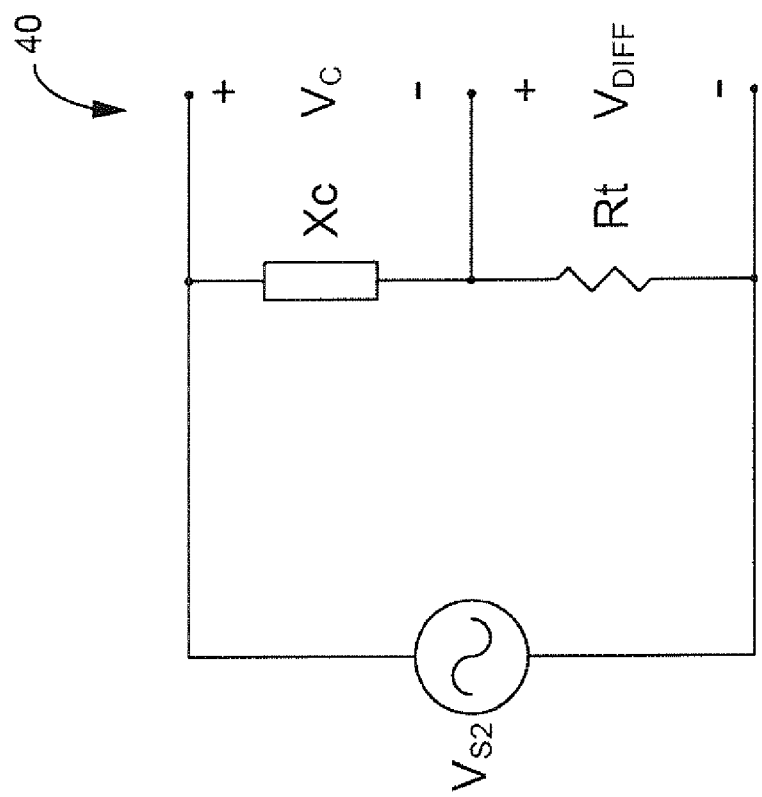
FIG. 3 shows a simplified model of a portion of the differentiator circuit in accordance with the preferred embodiment of FIG. 2.
Figure 4A:
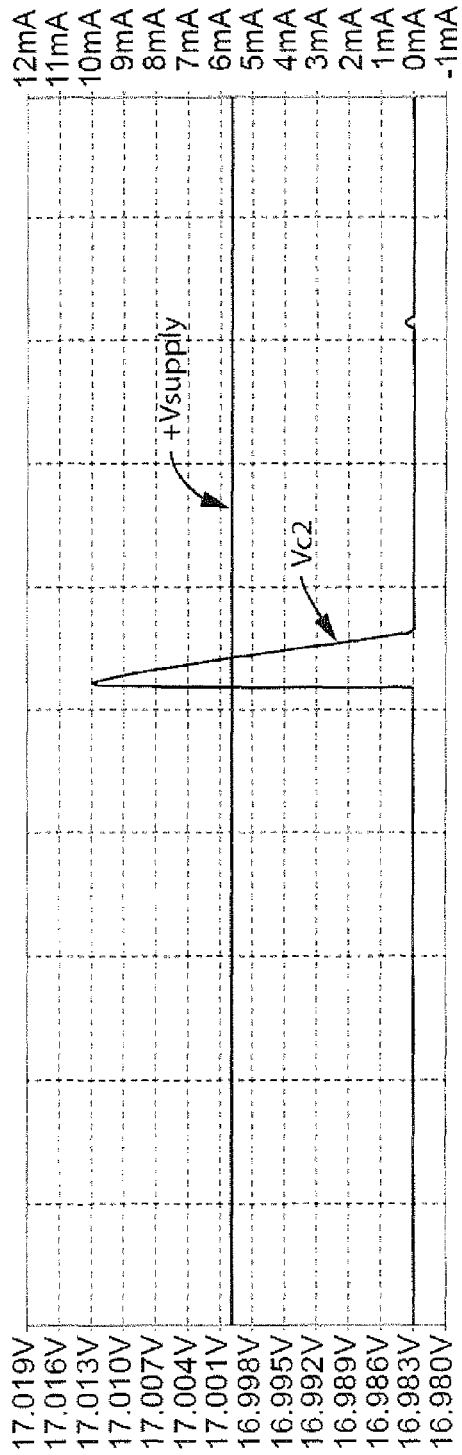
FIGS. 4A and 4B depict transient pre-charging of a reference voltage occurring within the preferred peak hold circuit of FIG. 2.
Figure 4B:
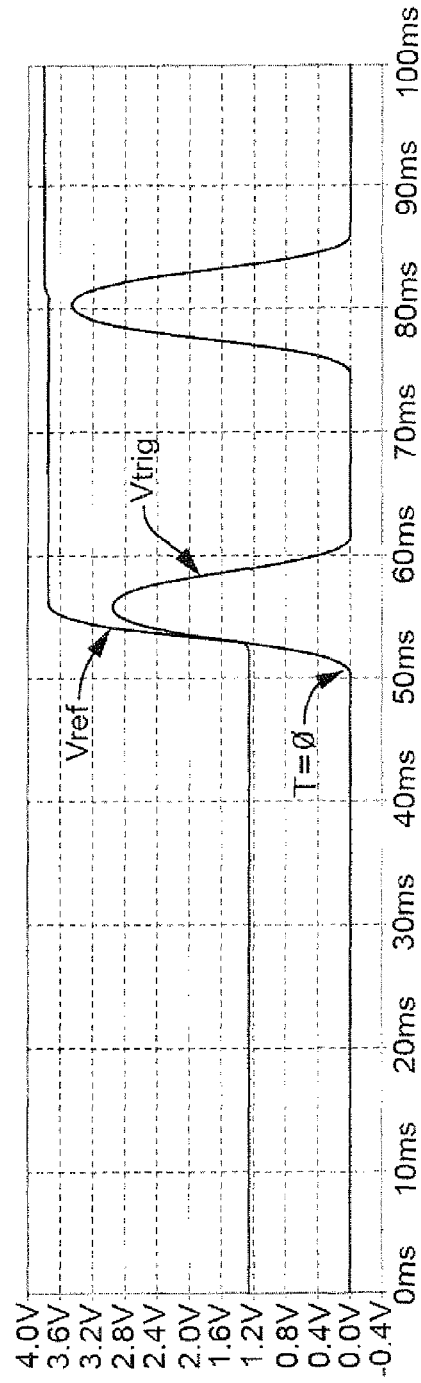

With joint reference now to FIGS. 2, 3, 4A and 4B, FIG. 4A shows the initial charge current of capacitor C2 and supply voltage+Vsupply at time t=0. FIG. 4B shows the voltage level rise at peak hold reference signal Vref in relation to differentiated audio input signal Vtrig at time t=0.

The voltage signal at capacitor C2 (peak hold reference signal Vref), applied to the positive input of U2 is approximately:

two forward bias diode voltage drops (Vf and Vbe) lower than Vs1.

Where:
Vpk=Voltage Peak at VS1;
Vf=Forward Voltage of D1; and
Vbe=Vbe Voltage of Q1.

In some applications it might be possible for noise artifacts (for example, in the form of AC line or switching noise) to overcharge capacitor C2. To ensure that peak hold reference signal Vref is not higher than intended due to such noise in the system, resistor R3 acts as a discharge path for capacitor C2. A wide variety of conventional peak hold options could be substituted for the particular configuration shown in FIG. 2, with possible minor modifications being within the skill of ordinary artisans. Care should be taken, however, to ensure that peak hold circuit voltage drops are balanced with differentiator circuit voltage drops, as is the case with the various embodiments disclosed herein.

With primary reference, again, to FIG. 2, the buffered audio signal VS2 at the output of op amp U1B is applied to capacitor C. Since, in this preferred embodiment, U1A and U1B are unity gain buffers, the voltage values at VS1 and VS2 (buffered audio signals) are assumed equal.

Focusing on differentiator 28, resistors R, R4, R5 (Rt) and capacitor C (in conjunction) form a differentiator, a phase shifter and a voltage divider. The steady state signal Vdiff (the differentiated audio input signal) will be less than or equal to the signal VS2 depending on the frequency of the input signal. FIG. 3 shows this voltage division for the differentiator. In particular, it is noted that the peak voltage at Vdiff is approximately equal to the peak voltage at VS2 for audio input signals at frequencies much greater than $1/(2\pi RC)$. By contrast, the peak voltage at Vdiff is less than the peak value at VS2 for audio input signals at frequencies much less than $1/(2\pi RC)$. This is due to the reactance of capacitor C, where the impedance of capacitor C is given by $Xc=1/(2\pi fC)$ and where f is the frequency signal VS2. A wide variety of conventional differentiator options could be substituted for the particular configuration shown in FIG. 2, with possible minor modifications being within the skill of ordinary artisans in light of this disclosure. Care should be taken, however, to ensure that differentiator circuit voltage drops are balanced with peak hold circuit voltage drops and that suitable phase-lagging is present, as is the case with the various embodiments disclosed herein.

Figure 5A:
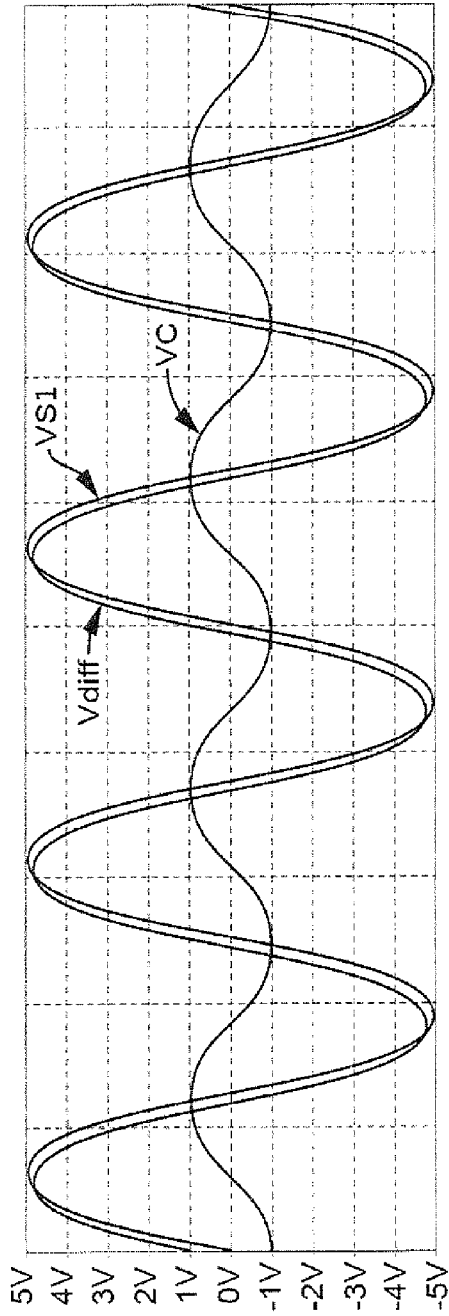
FIGS. 5A and 5B depict various signals occurring within the preferred audio signal clip detector of FIG. 2 when the received audio signal is not clipped.
Figure 5B:
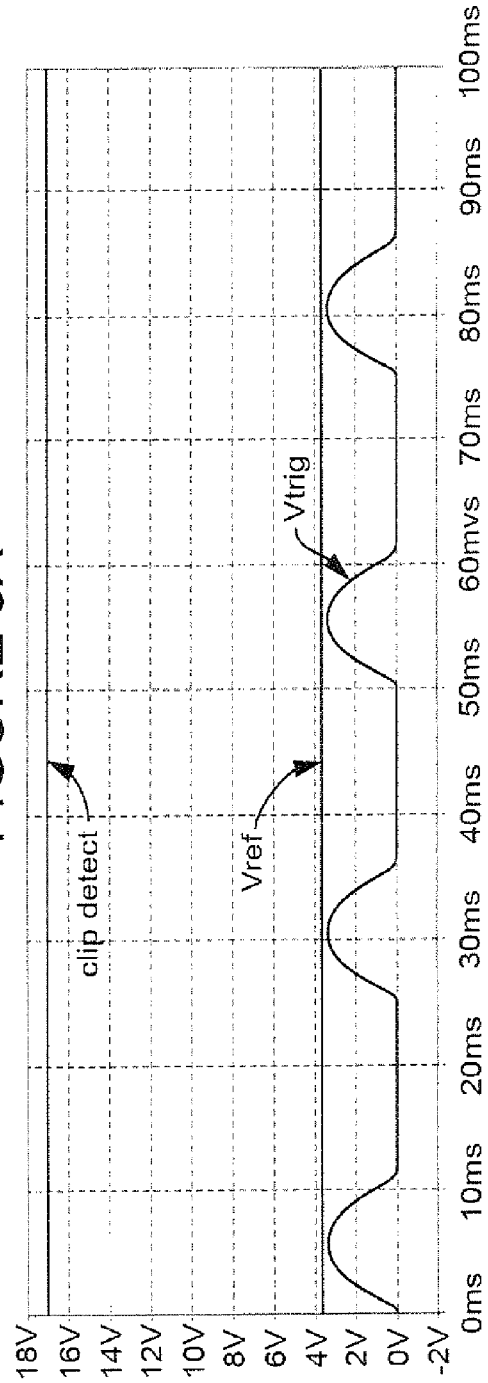

Operation of preferred clip detector 20 will now be discussed with reference to the signal traces and Fourier transform plots of FIG. 5A through FIG. 10. Turning first to FIG. 5A there is shown therein signals Vdiff, VS1, and Vc when presented with an non-clipped sine wave at a frequency where proper clip detection can occur (see discussion below). Vc is the voltage across the capacitor C. It can be seen that the peak value of differentiated audio signal Vdiff is below that of VS1. The value of Vdiff is the difference in voltage between VS2 and Vc where Vdiff=VS2−Vc. (See FIG. 3). It can be seen in FIG. 5B that when the absolute value of Vdiff is below the absolute value of VS1, Vtrig is below Vref and the output of U2 (the clip detect signal) is a voltage high. Those of skill in the art viewing FIGS. 5A, 6A and 7A will recognize that Vref is about 1.4 volts lower than an implied upstream voltage limit of about 5 volts due to two forward-bias-diode voltage-drops in the peak hold signal path.

Figure 6A:
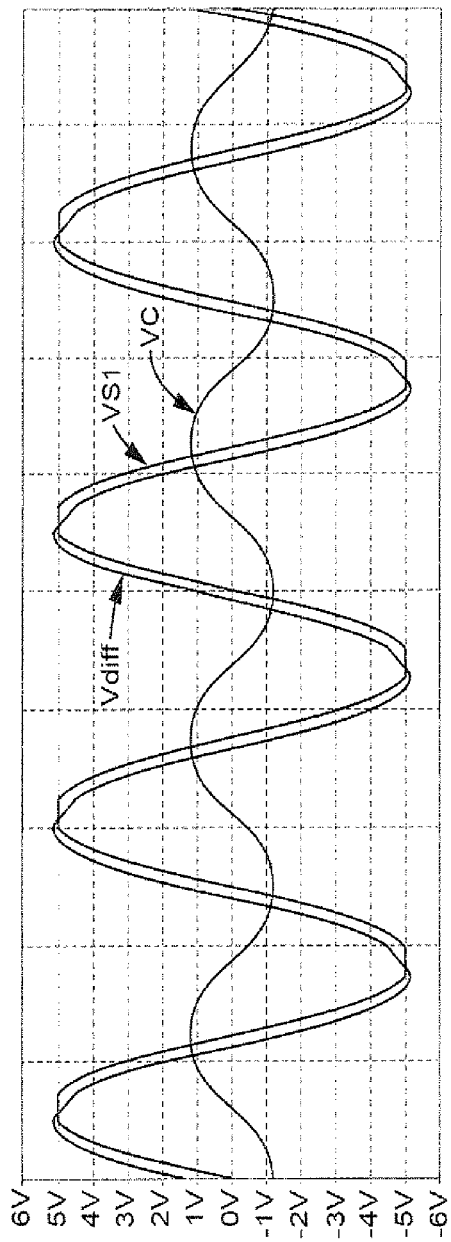
FIGS. 6A and 6B depict various signals occurring within the preferred audio signal clip detector of FIG. 2 when the received audio signal is clipped during 20% of the audio signal cycle.
Figure 6B:
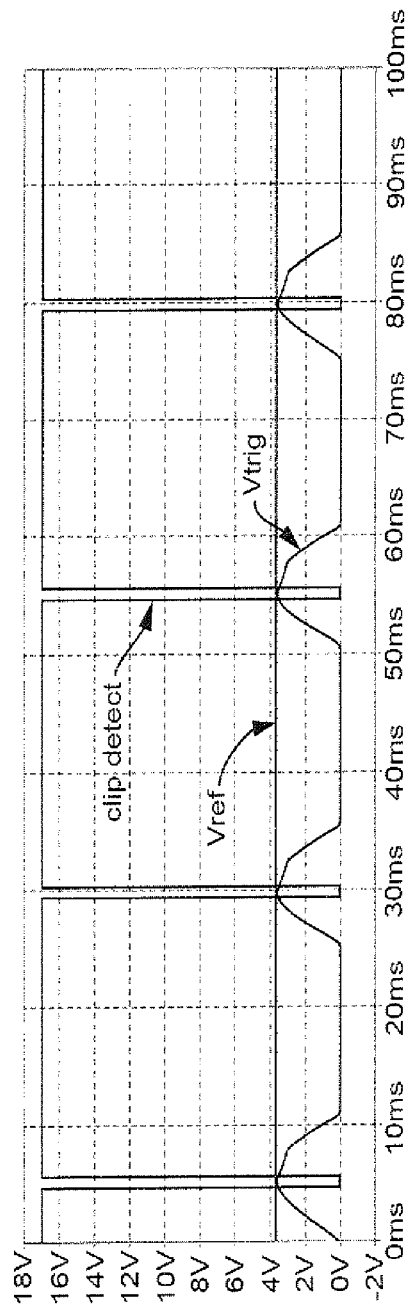

Turning now, primarily to FIGS. 6A and 6B, it can be seen that the Vdiff peak voltage will exceed VS1 when a clipped sine wave is received by audio signal input 22. A clipped audio input signal which causes Vdiff to exceed VS1 is limited to a calculated frequency range and clipping percentage. The detectable frequency range and clipping percentage is determined by the tuning of the values of resistors R, R4, R5 (Rt) and capacitor C.

Clipping percentage can be found by $C\% = (Tc/t)*100$.

Where:

Tc=total time duration of clipping within a single cycle of the signal; and

T=time duration of a single cycle of the signal.

FIG. 6A shows the values of Vdiff, VS1, and Vc when presented with a clipped sine wave. It can be seen that the peak value of Vdiff is higher than that of VS1. It can be seen in FIG. 6B that, when presented with a clipped signal, the peak value at Vtrig is higher than Vref at the onset of clipping. When the peak value of Vtrig surpasses Vref, the output of U2 (the clip detect signal) goes to a voltage low and remains there until/unless this condition no longer exists. This is known as the clip detect pulse.

For preferred clip detection conditions to occur, the minimum percentage of clipping should be at least about 20% of the total period of the audio input at the targeted frequency (here, a sine wave). The lower the clipping percentage of the total period, the narrower the detectable clipped frequency range becomes. The higher the clipping percentage, the broader the detectable clipped frequency range becomes. The Vdiff peak voltage is preferably at least 100 mV above VS1 for reliable input clip detection to occur. As noted above, Vdiff can be calculated as VS2−Vc, where Vc is the voltage drop across the capacitor. To obtain at least 100 mV above VS1 at Vdiff, the phase lag (a negative phase shift) of the signal voltage Vc across capacitor C should be between about 88 degrees and about 90 degrees. This corresponds to a phase lag (a negative phase shift) in signal Vdiff of between about 2 degrees and about 0 degrees. This phase lag will also correspond to a negative voltage drop in signal Vc of at least 0.1 volts (restated, −0.1V or more negative) and an equivalent positive voltage spike in signal Vdiff. Surprisingly, Vdiff phase lags of more than about 2 degrees result in little to no voltage spike in Vdiff and the magnitude of the Vdiff voltage spike increases for phase lags approaching the theoretical limit of 0 degrees. The impedance Xc of capacitor C in relation to the resistances of resistors R, R4, and R5 will determine the voltage drop across C and the corresponding voltage rise in Vdiff (where Xc is the impedance of capacitor C at any frequency and $Xc=1/(2\pi fC)$).

It has been found empirically that the preferred clip detector operating frequency range (at the preferred minimum 20% clipping) is between about 3.5(Rt/Xc) and about 9(Rt/Xc) (where 3.5(Rt/Xc) represents the lowest frequency of the range and 9(Rt/Xc) represents the highest frequency of the range). Where Rt is the total resistance for positive going signals of R and R5 in parallel expressed as (R*R5)/(R+R5). When considering negative going signals, Rt is the total resistance of R and R4 in parallel expressed as (R*R4)/(R+R4). The preferred frequency range in which clipping may be detected may be determined as follows:

$f_{LOW} = 1/(2\pi * X_{CL} * C)$;

$f_{HIGH} = 1/(2\pi * X_{CH} * C)$;

$X_{CL}$ for $f_{LOW} = Rt/3.5$; and $X_{CH}$ for $f_{HIGH} = Rt/9$, where $f_{LOW}$ is the lowest frequency and $f_{HIGH}$ is the highest frequency.

Many audio amplifier applications typically fall into low frequency and or high frequency applications (e.g., bi-amplified systems). In such applications, it is preferred to design the clip detection frequency range around the nominal range of frequencies required for an amplifier application. Setting the clip detect range can be done by first selecting the target frequencies.

In a low frequency application, the lowest practical frequency is 20 Hz. Based on this application, $f_{LOW}$ can be set to 20 Hz. A reasonable standard value capacitor for low frequency clip detection is 10 uF.

At 20 Hz, $X_{CL}=1/(2\pi *20$ Hz$^* .10$ uF$)=796$ Ohms;

$Rt=X_{CL}*3.5=796$ Ohms$*3.5=2.8$K Ohms;

When applying:

$f_{LOW}=1/(2\pi *X_{CL}*C)=20$ Hz;

For solving at $f_{HIGH}$:

$X_{CH}=Rt/9=2.8$K$/9=311$ ohms;

When applying:

$f_{HIGH}=1/(2\pi *X_{CH}*C)=51$ Hz.

In low frequency applications where 20 Hz is not the desired $f_{LOW}$, the frequency can be shifted by adjusting Rt. Assuming 50 Hz is the desired $f_{LOW}$ At 50 Hz, $X_{CL}=1/(2\pi *50$ Hz$^* .10$ uF$)=318$ Ohms;

$Rt=318*3.5=1.1$K Ohms;

$f_{LOW}=50$ Hz;

$f_{HIGH}=130$ Hz.

In a high frequency application, 1 kHz, is an appropriate nominal target frequency for clip detection. 1 kHz could be preferred as the center frequency of the clip detect range. To solve for Rt use $X_{CN}*6.25$ (where $X_{CN}$ is the capacitor's impedance at the nominal frequency and 6.25 is the median ratio between 3.5 and 9). A reasonable standard value capacitor for high frequency clip detection is 0.47 uF.

At 1 kHz $X_{CN}=1/(2\pi *1000$ Hz$^* .47$ uF$)=339$ ohms;

$Rt=339$ Ohms$*6.25=2.11$ k;

When solving for $f_{Low}$:

$X_{CL}=2.11$ k$/3.5=603$;

$f_{LOW}=1/(2\pi *X_{CL}*C)=561$ Hz.

When solving for $f_{HIGH}$:

$X_{CH}=2.11$ k$/9=234$;

$f_{HIGH}=1/(2\pi *X_{CH}*C)=1.44$ kHz.

It will be appreciated that diodes D4 and D5 also rectify the audio signal and compensate for forward voltage losses of diode D1 and transistor Q1 Vbe and seen at output of peak hold 26. This compensation maintains a substantially equal voltage to the non-inverting and inverting inputs of U2 when a signal is received. As a result of this configuration, the rectified differentiator audio signal at the negative input of U2 is Vtrig. Vtrig peak value is Vtrig=Vdiff−Vf4−Vf5, where Vf4 equals the forward peak voltage across D4 and Vf5 equals the forward peak voltage across D5.

It will further be appreciated that diodes D3 and D2, and resistor R4 create a balanced AC load for the output of the differentiator. The load balance prevents voltage offset at Vdiff that would otherwise cause a false clip detect.

Figure 8:
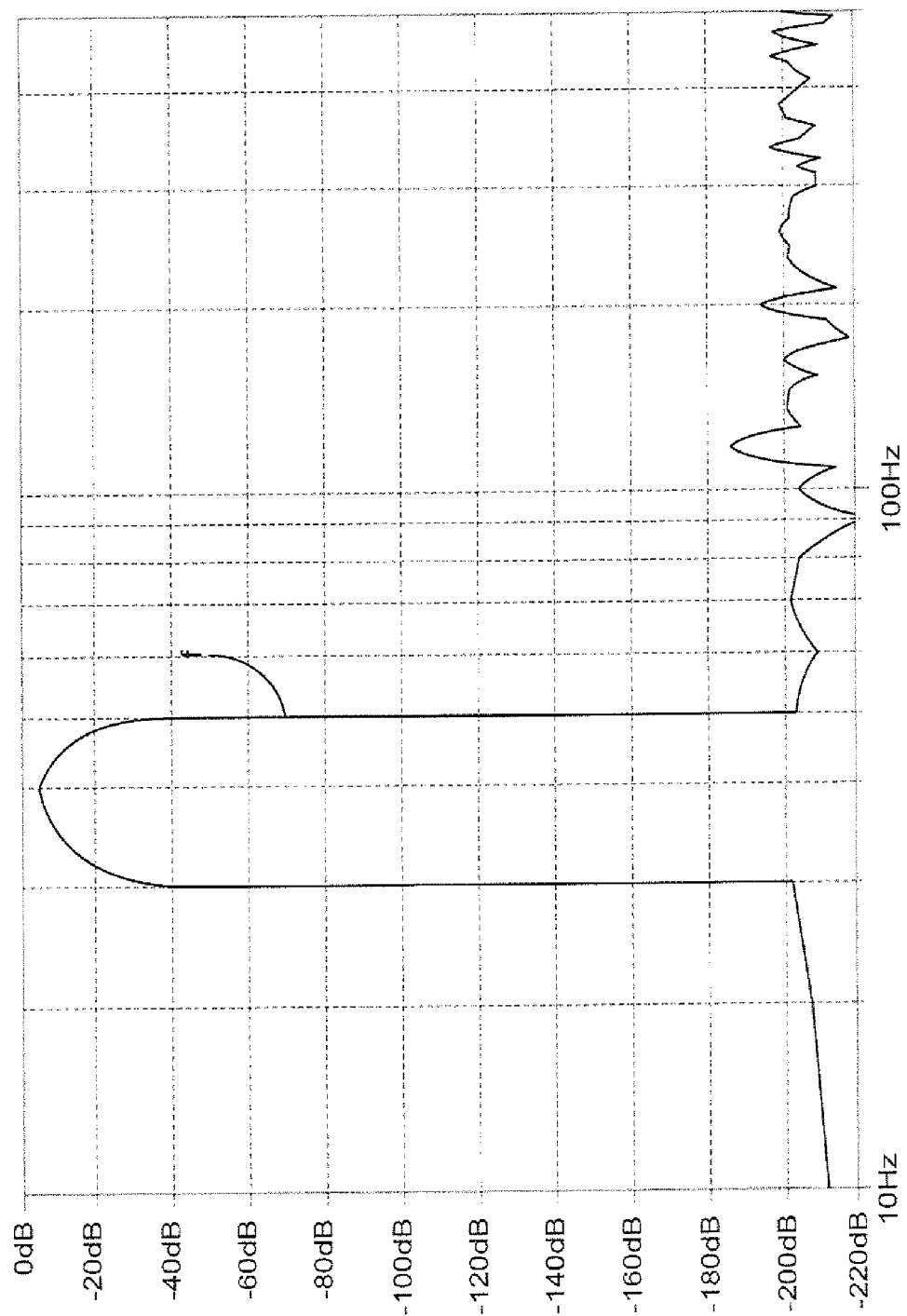
FIG. 8 is a partial Fourier transform plot of a non-clipped 40 Hz audio signal as detected using the preferred embodiment of FIG. 2.
Figure 9:
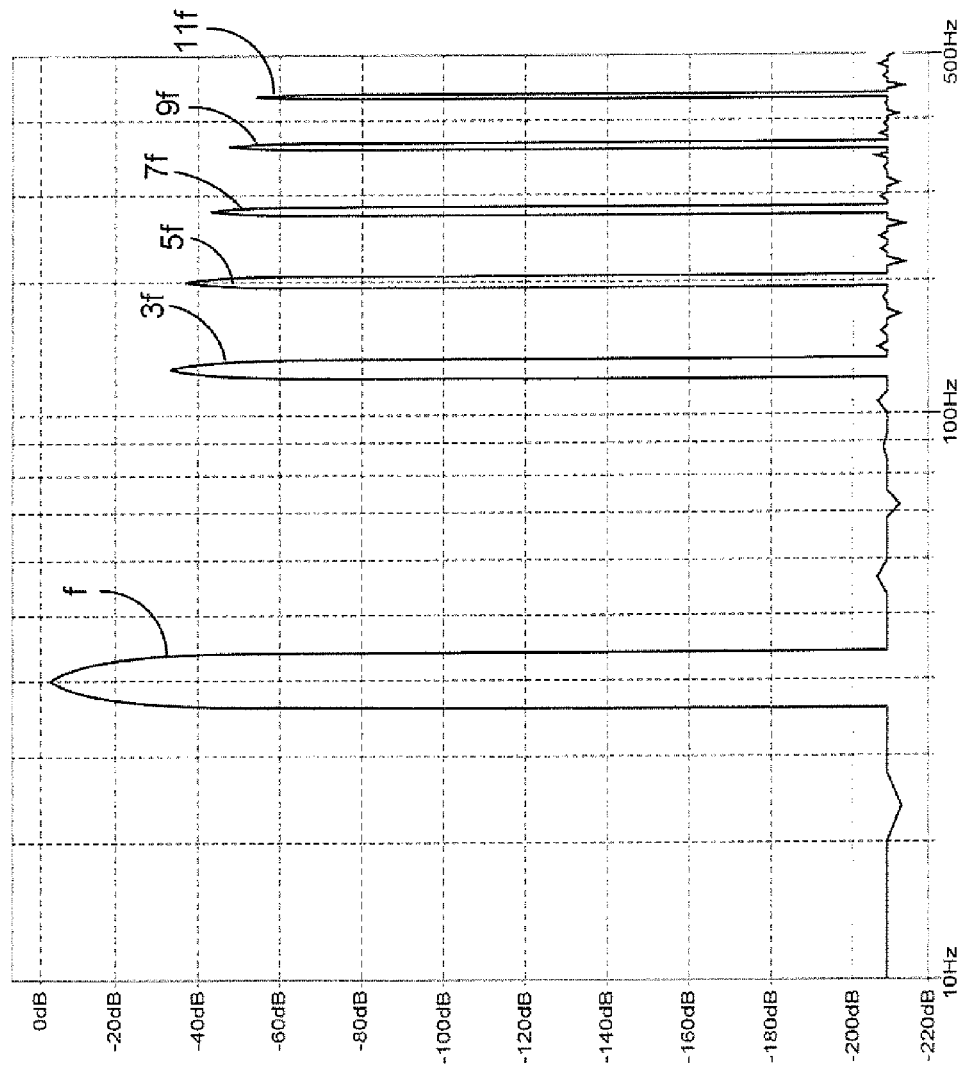
FIG. 9 is a partial Fourier transform plot of a 40 Hz audio signal that is clipped during 20% of the audio signal cycle.
Figure 10:
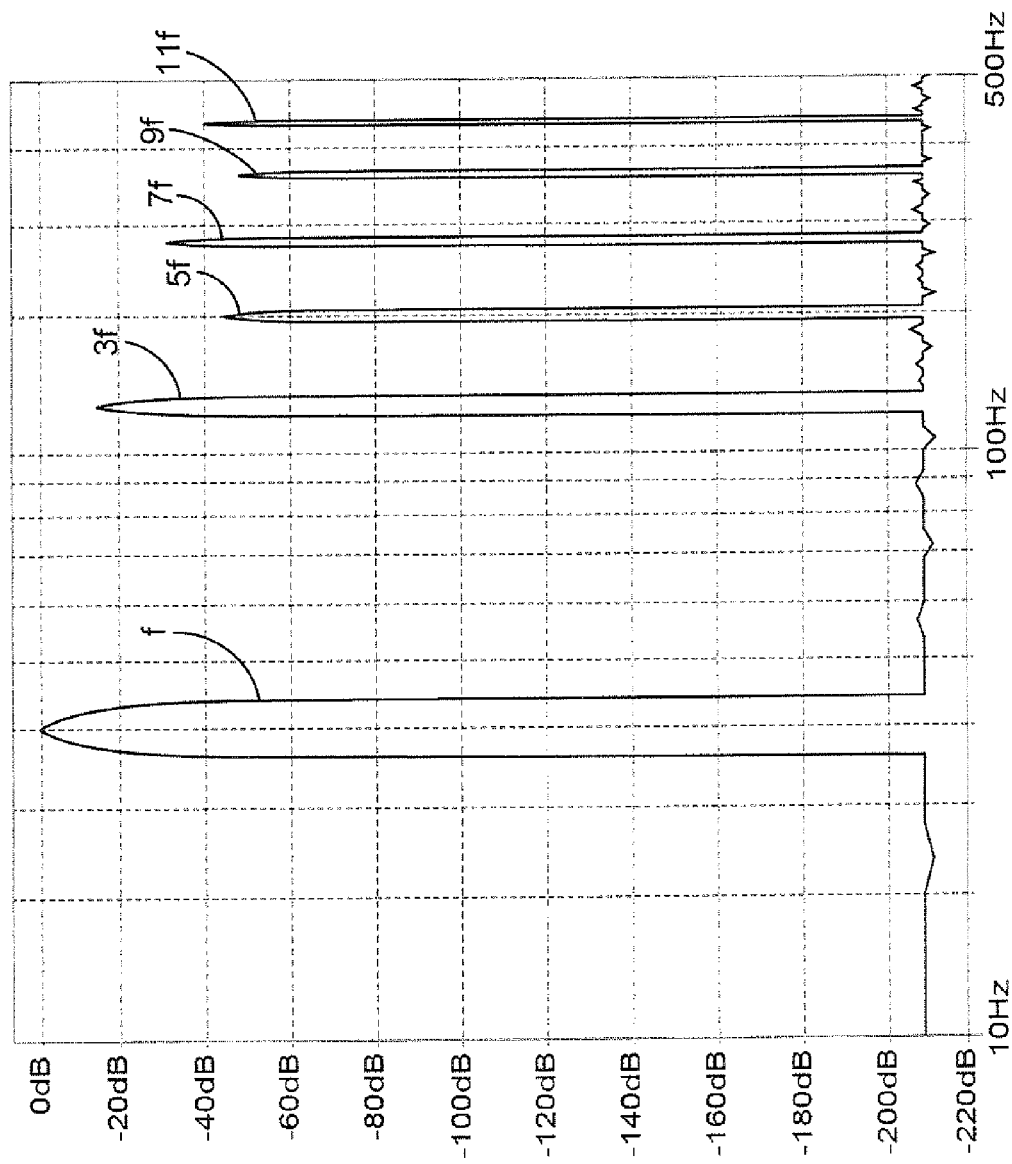
FIG. 10 is a partial Fourier transform plot of a 40 Hz audio signal that is clipped during 57% of the audio signal cycle.

To a point, the peak voltage at Vdiff is proportional to the percentage of time period clipping. Because of this relationship, an increase in clipping percentage will increase the applicable frequency range of clip detection. As the percentage of clipping increases, the amplitude of the $3^{th}$, $5^{th}$, and $7^{th}$ harmonics of the fundamental frequency also increase. This is true at the moment the angular voltage rise of the audio signal transitions to DC, or clipping. Xc is lower at the higher harmonic frequencies due to the inversely proportional relationship of Xc versus frequency. When harmonic amplitudes increase at the moment of clipping, Xc is reduced at those frequencies, and the resulting voltage seen across resistor R (labeled Vdiff) is increased. FIG. 8 shows the Fourier transform response of an unclipped 40 Hz sine wave. FIG. 9 shows the Fourier transform response of a 40 Hz sine wave exhibiting 20% clipping. FIG. 10 shows the Fourier transform response of a 40 Hz sine wave exhibiting 57% clipping. It can be seen that the harmonic amplitudes are greater at the $3^{rd}$, $5^{th}$, and $7^{th}$ harmonics as the clipping percentage increases.

Figure 7A:
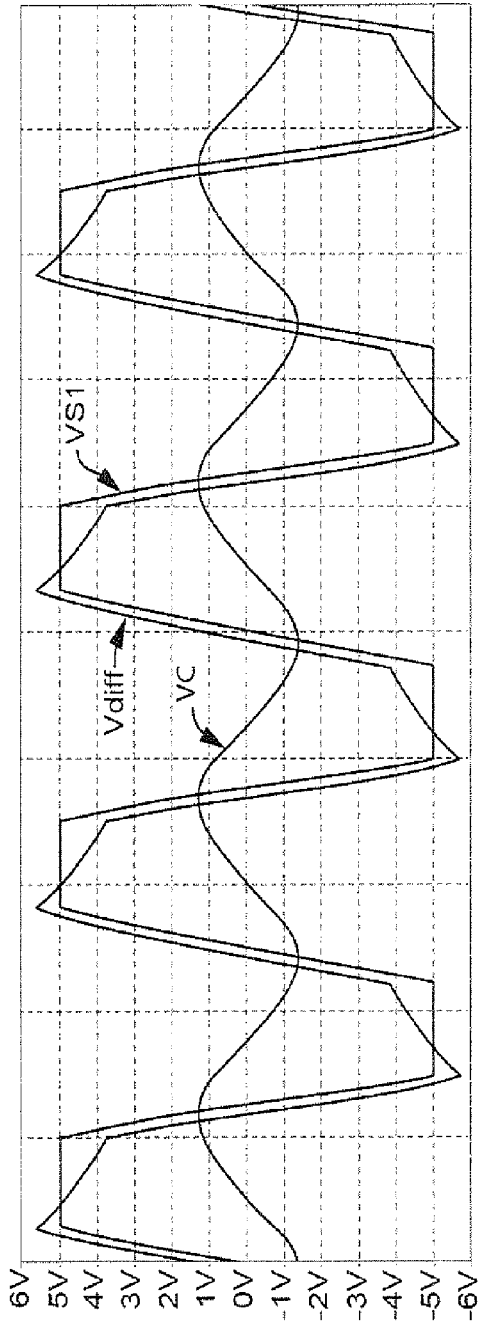
FIGS. 7A and 7B depict various signals occurring within the preferred audio signal input clip detector of FIG. 2 when the received signal is clipped during 57% of the audio signal cycle.
Figure 7B:
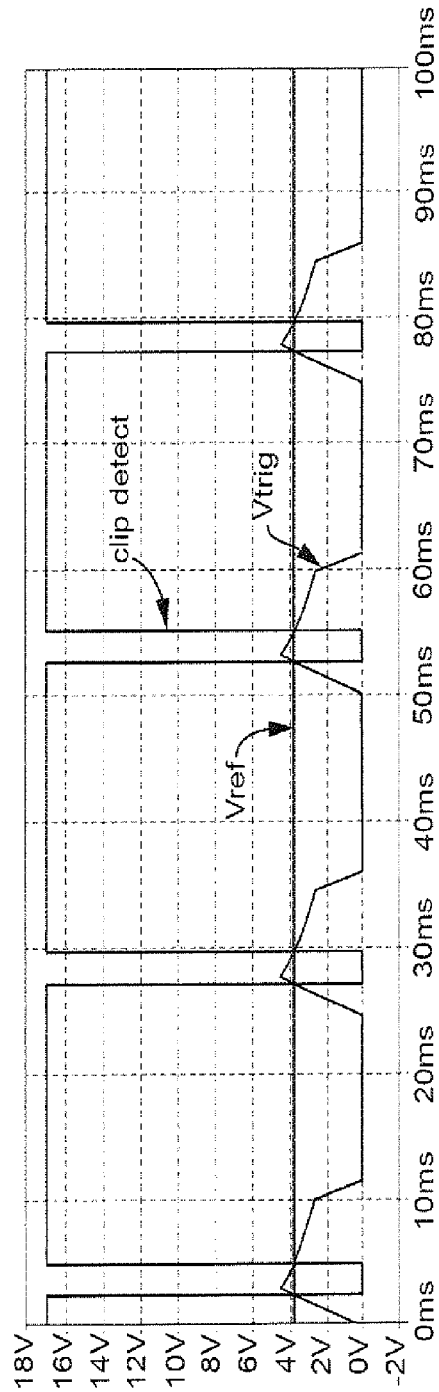

Increased Vdiff peak value due to clipping over 20% can be seen in FIG. 6A and FIG. 6B. The clipping percentage in FIG. 7A and FIG. 7B is approximately 57%. It can be seen that the increased clipping has also increased the clip detect error signals duty cycle. This is due to the increase in duration of time that Vdiff peak voltage is above VS1 peak voltage.

Figure 11:
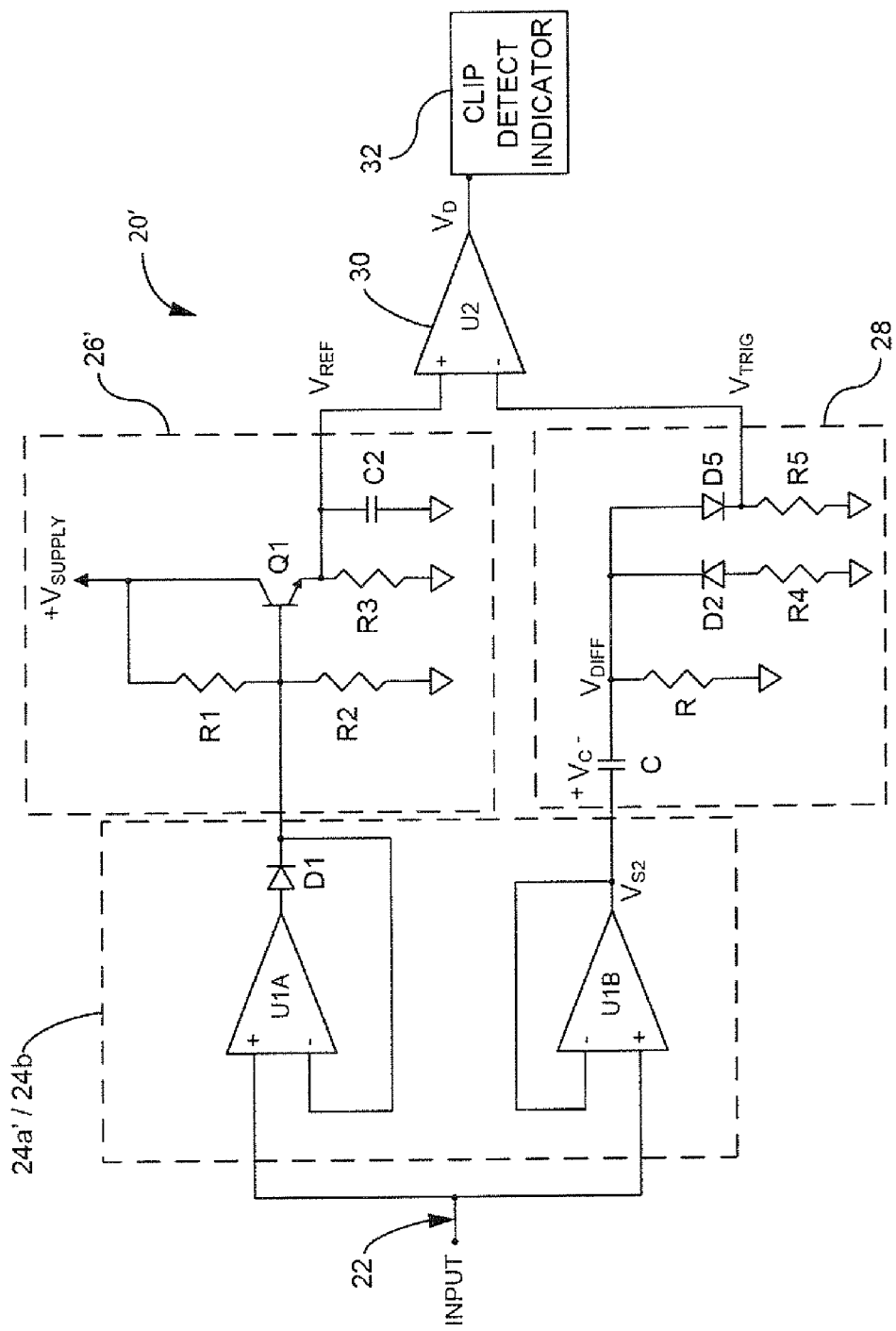
FIG. 11 is a schematic diagram of the audio signal clip detector in accordance with a second preferred analog circuitry embodiment of the present invention.

FIG. 11 is a schematic diagram of an audio signal clip detector 20' in accordance with a second preferred embodiment of the present invention. In this Figure, the feedback of op amp U1A (24a') includes diode D1. This effectively eliminates need to use diodes D3 and D4 in the differentiator 28' as compared with the preferred embodiment(s) of FIGS. 2-10. Otherwise, this circuit operates in at least generally the same manner as the prior discussed embodiments with the differences readily apparent to those of skill in the art.

Figure 12:
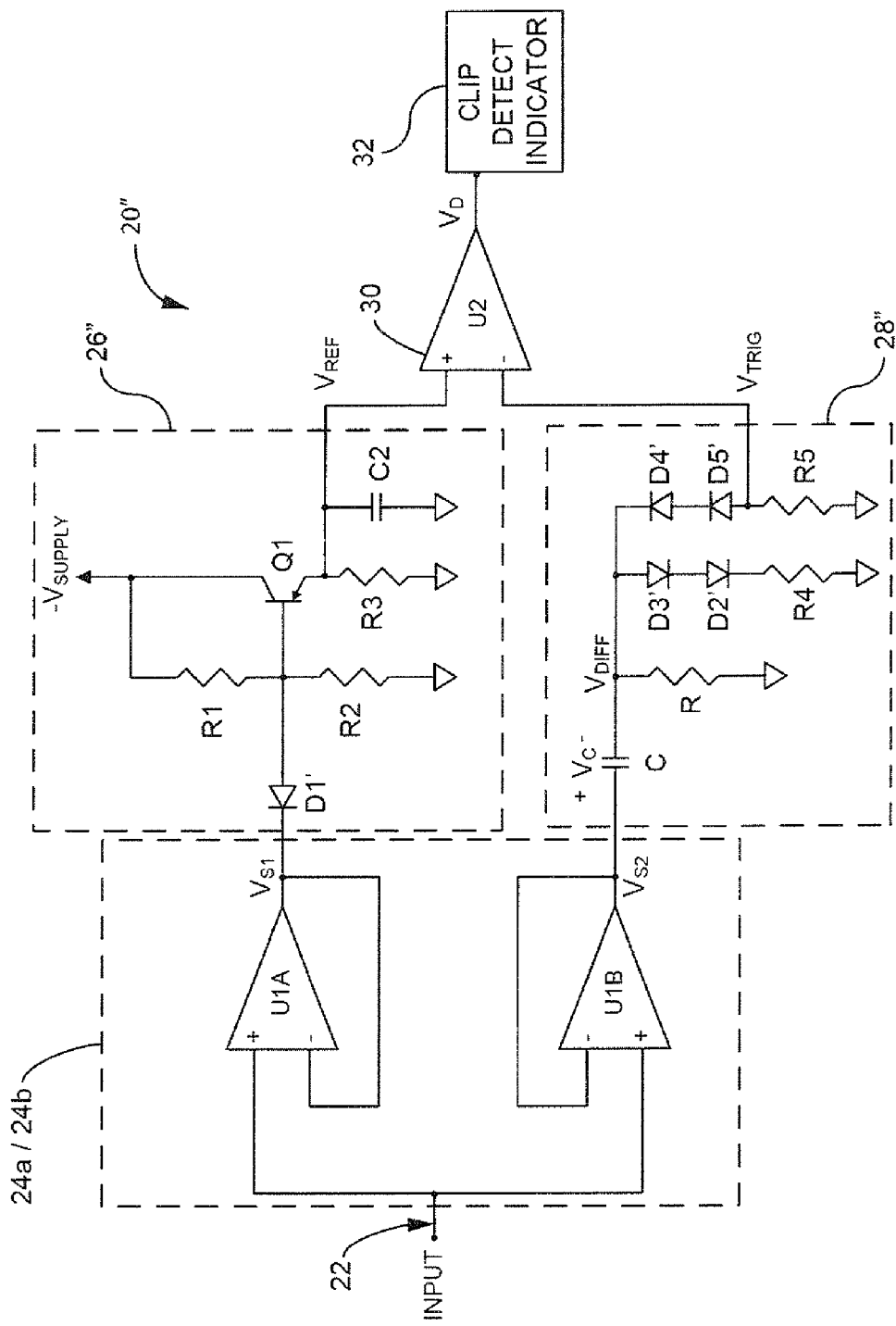
FIG. 12 is a schematic diagram of the audio signal clip detector in accordance with a third preferred analog circuitry embodiment of the present invention.

FIG. 12 is a schematic diagram of an audio signal clip detector 20" in accordance with a third preferred embodiment of the present invention. Unlike the above-discussed preferred embodiments of the invention using positive rectification to achieve clip detection, the preferred embodiment of FIG. 12 uses negative rectified signals to achieve clip detection. Otherwise, this circuit operates in at least generally the same manner as the prior discussed embodiments with the differences readily apparent to those of skill in the art.

It will be appreciated that the present invention permits detection of clipped audio signals as a function of that audio signal itself. Thus, the clip detection described herein is not reliant on a predicted maximum unclipped signal at any one or more stages along the signal path. Indeed, the detector described herein has the ability to detect clipped and non-clipped audio signals when the voltage limitations of upstream audio sources is unknown. However, those of ordinary skill will appreciate, in light of the inventive disclosure, that the invention is even capable of identifying implied/deduced voltage limitations of upstream audio sources. For example, in the embodiment of FIGS. 2-10 it is readily apparent that the audio input signal shown is voltage limited to about 5 volts (somewhere upstream of detector 20) even though the supply voltage for the preferred detector is about 17 volts.

The detection pulse produced when clipping is detected can be used to perform any one or more of several functions in an audio system. A given audio application can help determine how best to use the clip detect pulse. Some of the possible uses include, to produce a visual clip indicator, to produce an audible clip indicator, to trigger signal-compression or distortion reduction/prevention, and/or to record clip events, etc.

Clip detect indicator 32 is preferably one or more conventional LED's but may be any one of the many conventional types of visual indicators (LED's, liquid crystal displays, CRT's, etc.), audible indicators (piezo tweeters, speakers, etc), vibratory indicators, and/or digital recording means.

Comparator/Processor 30 may be implemented as any one of the many known forms of comparators but it also may be implemented in any configuration that functions to receive two or more values/signals and to produce a predictable result based on those values/signals. For example, comparator 30 may be implemented as ratio circuitry which yields a clip detect alert when the ratio of the two input signals is less than (or greater than) one. Other equivalent implementations are well within the skill in the art and the term comparator is intended to literally encompass those as well.

Those of ordinary skill will readily appreciate that various aspects of the present invention (including, but not limited to the disclosed peak holds, differentiators, comparators/processors) may be implemented in hardware, software and/or firmware; such implementations are intended to be encompassed by the literal terms of the appended claims and the claims expressly intended to be interpreted as such.

For simplicity, certain preferred embodiments have been discussed/explained using sine waves for the received audio input signal(s) and it has been indicated that the invention may be used with known methods of "ringing out" an audio system. However, it will be appreciated that the invention is not so limited. For example, and as discussed above, the frequency characteristics of the preferred differentiator circuitry exhibit a natural tendency to reject frequencies outside of a desired target range. Therefore, the invention is capable of clip detection at frequencies within that range even if the received audio signal contains other frequencies. Although some limitations may apply and some audio signals may perform better than others, this characteristic enables inventive clip detection to use conventional wide range music as the audio input signal.

While the present invention has been described in connection with what is presently considered to be the most practical and preferred embodiments, it is to be understood that the invention is not limited to the disclosed embodiments, but is intended to encompass the various modifications and equivalent arrangements included within the spirit and scope of the appended claims. With respect to the above description, for example, it is to be realized that the optimum dimensional relationships for the parts of the invention, including variations in size, materials, shape, form, function and manner of operation, assembly and use, are deemed readily apparent to one skilled in the art, and all equivalent relationships to those illustrated in the drawings and described in the specification are intended to be encompassed by the appended claims. Therefore, the foregoing is considered to be an illustrative, not exhaustive, description of the principles of the present invention.

Other than in the operating examples or where otherwise indicated, all numbers or expressions referring to quantities of ingredients, reaction conditions, etc. used in the specification and claims are to be understood as modified in all instances by the term "about." Accordingly, unless indicated to the contrary, the numerical parameters set forth in the following specification and attached claims are approximations that can vary depending upon the desired properties, which the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

For purposes of the description hereinafter, the terms "upper", "lower", "right", "left", "vertical", "horizontal", "top", "bottom", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

What is claimed is:

1. An audio signal clip detector, comprising:
   an audio input for receiving the audio signal;
   a peak hold circuit, electrically associated with the audio input, for generating a peak reference signal indicative of the highest voltage of the audio signal received by the audio input;
   a differentiator circuit, electrically associated with the audio input, for differentiating and phase-lagging the audio signal received by the audio input to thereby produce a differentiated audio signal and for rectifying the differentiated audio signal to thereby produce a rectified differentiator signal, wherein the differentiator phase-lags the audio signal received by the audio input by between about 2 degrees and about 0 degrees;
   a comparator circuit, electrically associated with the peak hold circuit and the differentiator circuit, for comparing the rectified differentiator signal and the peak reference signal to thereby produce a clip detect signal indicative of whether the audio signal received by the audio input is clipped; and
   an indicator, responsive to the clip detect signal, for indicating whether the audio signal received at the audio input is clipped.

2. The audio signal clip detector of claim 1 wherein the received audio signal is received from an upstream signal path with an implied voltage limitation, and wherein the comparator produces a clip detect signal indicative of a clipped received audio signal responsive to the differentiated audio signal peak being higher than the implied upstream voltage limitation.

3. The audio signal clip detector of claim 1 wherein the received audio signal is a wide-range music signal and wherein the comparator circuit comprises a comparator for establishing a ratio of the rectified differentiator signal and the peak reference signal.

4. The audio signal clip detector of claim 1 wherein the clip detect signal changes from one of a voltage high and a voltage low to the other of a voltage high and a voltage low responsive to the absolute value of the differentiated audio signal being greater than the absolute value of received audio signal.

5. The audio signal clip detector of claim 1 further comprising a housing that encloses the audio input, the peak hold circuit, the differentiator circuit, the comparator circuit, and the indicator such that the audio input and the indicator are user-accessible.

6. The audio signal clip detector of claim 1 wherein the clip detect signal indicates that the received audio signal is clipped in response to the rectified differentiator signal exceeding the peak reference signal.

7. The audio signal clip detector of claim 1 wherein the differentiator circuit includes a negative rectifier for rectifying the differentiated audio signal to thereby produce the rectified differentiator signal.

8. The audio signal clip detector of claim 1 further comprising a buffer electrically disposed between the audio input and the peak hold circuit for buffering the audio signal received by the audio input, the buffer comprising a negative feedback loop with a rectifier in the loop.

9. The audio signal clip detector of claim 1 wherein the differentiator has a resistance, a reactance, and an operating frequency range that is between about 3.5 times the ratio of the resistance divided by the reactance and about 9.0 times the ratio of the resistance divided by the reactance.

10. An audio signal clip detector, consisting essentially of:
an audio input for receiving the audio signal;
a peak hold, electrically associated with the audio input, for generating a peak reference signal indicative of the highest voltage of the audio signal received by the audio input;
one differentiator, electrically associated with the audio input, for differentiating and phase-lagging the audio signal received by the audio input to thereby produce one differentiated audio signal and a rectifier for rectifying the one differentiated audio signal to thereby produce one rectified differentiator signal;
a comparator, electrically associated with the peak hold and the differentiator, for comparing the one rectified differentiator signal and the peak reference signal to thereby produce a clip detect signal indicative of whether the audio signal received by the audio input is clipped; and
an indicator, responsive to the clip detect signal, for indicating whether the audio signal received at the audio input is clipped.

11. The audio signal input clip detector of claim 10 wherein the differentiator has a resistance, a reactance, and an operating frequency range that is between about 3.5 times the ratio of the resistance divided by the reactance and about 9.0 times the ratio of the resistance divided by the reactance.

12. The audio signal input clip detector of claim 10 wherein the received audio signal is received from an upstream signal path with an implied voltage limitation, and wherein the comparator produces a clip detect signal indicative of a clipped received audio signal responsive to the differentiated audio signal peak being higher than the implied upstream voltage limitation.

13. A method of detecting audio signal clipping, comprising:
receiving an audio signal;
generating a peak hold reference signal indicative of the highest voltage of the received audio signal;
differentiating and phase-lagging the received audio signal to thereby produce a differentiated audio signal, wherein the step of differentiating and phase-lagging phase-lags the audio signal received by the audio input by between about 2 degrees and about 0 degrees;
rectifying the differentiated audio signal to thereby produce a rectified differentiator signal;
comparing the rectified differentiator signal and the peak reference signal to thereby produce a clip detect signal indicative of whether the received audio signal is clipped; and
responsive to the clip detect signal indicating that the received audio signal is clipped, indicating whether the received audio signal is clipped.

14. The method of claim 13 wherein the step of rectifying further comprises negatively rectifying the differentiated audio signal to thereby produce the rectified differentiator signal.

15. The method of claim 13 wherein the step of receiving an audio signal comprises receiving a wide-range music signal and wherein the step of comparing further comprises establishing a ratio of the rectified differentiator signal and the peak reference signal.

16. The method of claim 13 wherein the step of receiving an audio signal comprises receiving an audio signal from an upstream signal path with an implied voltage limitation, and wherein the step of comparing further comprises producing a clip detect signal indicative of a clipped received audio signal responsive to the differentiated audio signal peak being higher than the implied upstream voltage limitation.

17. An audio signal clip detector, comprising:
an audio input for receiving the audio signal;
a peak hold circuit, electrically associated with the audio input, for generating a peak reference signal indicative of the highest voltage of the audio signal received by the audio input;
a differentiator circuit, electrically associated with the audio input, for differentiating and phase-lagging the audio signal received by the audio input to thereby produce a differentiated audio signal and for rectifying the differentiated audio signal to thereby produce a rectified differentiator signal;
a comparator circuit, electrically associated with the peak hold circuit and the differentiator circuit, for comparing the rectified differentiator signal and the peak reference signal to thereby produce a clip detect signal indicative of whether the audio signal received by the audio input is clipped;
an indicator, responsive to the clip detect signal, for indicating whether the audio signal received at the audio input is clipped; and
a buffer electrically disposed between the audio input and the peak hold circuit for buffering the audio signal received by the audio input, the buffer comprising a negative feedback loop with a rectifier in the loop.

18. An audio signal clip detector, comprising:
an audio input for receiving the audio signal;
a peak hold circuit, electrically associated with the audio input, for generating a peak reference signal indicative of the highest voltage of the audio signal received by the audio input;
a differentiator circuit, electrically associated with the audio input, for differentiating and phase-lagging the audio signal received by the audio input to thereby produce a differentiated audio signal and for rectifying the differentiated audio signal to thereby produce a rectified differentiator signal, wherein the differentiator has a resistance, a reactance, and an operating frequency range that is between about 3.5 times the ratio of the resistance divided by the reactance and about 9.0 times the ratio of the resistance divided by the reactance;
a comparator circuit, electrically associated with the peak hold circuit and the differentiator circuit, for comparing the rectified differentiator signal and the peak reference signal to thereby produce a clip detect signal indicative of whether the audio signal received by the audio input is clipped; and an indicator, responsive to the clip detect signal, for indicating whether the audio signal received at the audio input is clipped.

* * * * *